(12) United States Patent
Li (10) Patent No.: US 11,700,707 B2
(45) Date of Patent: Jul. 11, 2023

(54) MEMORY DEVICE

(71) Applicant: Shannon Systems Ltd., Shanghai (CN)

(72) Inventor: Jiangshan Li, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 25 days.

(21) Appl. No.: 17/509,358

(22) Filed: Oct. 25, 2021

(65) Prior Publication Data

US 2022/0369502 A1 Nov. 17, 2022

(30) Foreign Application Priority Data

May 14, 2021 (CN) .......................... 202121042274.9

(51) Int. Cl.
*H05K 7/20* (2006.01)
*H05K 5/00* (2006.01)
*G06F 1/20* (2006.01)

(52) U.S. Cl.
CPC .......... *H05K 7/20154* (2013.01); *G06F 1/20* (2013.01); *H05K 7/20127* (2013.01)

(58) Field of Classification Search
CPC ... H05K 7/20154; H05K 7/20127; G06F 1/20
See application file for complete search history.

(56) References Cited

U.S. PATENT DOCUMENTS

| | | | | |
|---|---|---|---|---|
| 2011/0286173 | A1* | 11/2011 | Moore | G11B 33/08 29/458 |
| 2012/0070711 | A1* | 3/2012 | Souki | H01M 50/258 429/120 |
| 2017/0060195 | A1* | 3/2017 | Kim | G06F 1/182 |
| 2017/0060199 | A1* | 3/2017 | Kim | G06F 1/20 |
| 2018/0142961 | A1* | 5/2018 | Wu | F28D 15/0266 |
| 2020/0075453 | A1* | 3/2020 | Kim | H01L 23/3677 |
| 2020/0260602 | A1* | 8/2020 | Gao | H05K 7/20418 |
| 2020/0350229 | A1* | 11/2020 | Chang | H01L 23/3733 |
| 2021/0015005 | A1* | 1/2021 | Yu | F25D 23/006 |
| 2021/0015006 | A1* | 1/2021 | Muto | H05K 5/0008 |
| 2021/0092871 | A1* | 3/2021 | Hur | H05K 7/20145 |
| 2021/0153340 | A1* | 5/2021 | Lee | H05K 7/20445 |
| 2022/0225541 | A1* | 7/2022 | Chen | H05K 7/20809 |
| 2022/0346273 | A1* | 10/2022 | Chen | G06F 1/182 |

\* cited by examiner

*Primary Examiner* — Michael A Matey
(74) *Attorney, Agent, or Firm* — McClure, Qualey & Rodack, LLP (57) ABSTRACT

A memory device includes a device housing, a memory module, and a cooling unit. The memory module is disposed in the device housing, wherein the memory module generates heat, and the heat is transmitted to the device housing. The cooling unit is thermally connected to the device housing to dissipate some of the heat. The cooling unit includes a unit housing and a working fluid. An interior space is formed in the unit housing. The working fluid is disposed in the interior space, wherein some of the heat travels from the device housing, passes through the unit housing, and is transmitted to the working fluid.

13 Claims, 9 Drawing Sheets

MEMORY DEVICE

CROSS REFERENCE TO RELATED APPLICATIONS

This application claims priority of China Patent Application No. 202121042274.9, filed on May 14, 2021, the entirety of which is incorporated by reference herein.

BACKGROUND OF THE INVENTION

Field of the Invention

The present invention relates to a memory device, and in particular to a memory device with a cooling unit.

Description of the Related Art

With increased storage capacity and transmission speed requirements, the power of solid-state disks has increased, and the running temperature of a solid-state disk during operation is high. Conventionally, to prevent excessive temperatures in a 2.5-inch solid-state disk, power to the solid-state disk cannot exceed 25 Watts, which restricts the storage capacity of the memory device.

BRIEF SUMMARY OF THE INVENTION

Embodiments of the invention are provided to address the aforementioned difficulty.

In one embodiment, a memory device includes a device housing, a memory module and a cooling unit. The memory module is disposed in the device housing, wherein the memory module generates heat, and the heat is transmitted to the device housing. The cooling unit is thermally connected to the device housing to dissipate some of the heat. The cooling unit includes a unit housing and a working fluid. An interior space is formed in the unit housing. The working fluid is disposed in the interior space, wherein some of the heat travels from the device housing, passes through the unit housing, and is transmitted to the working fluid.

In one embodiment, the interior space comprises a chamber, the working fluid is disposed in the chamber, a heat conductive structure is formed in the chamber, and the heat conductive structure contacts the working fluid.

In one embodiment, the heat conductive structure comprises a plurality of heat conductive posts, and the heat conductive posts are arranged in a matrix.

In one embodiment, the unit housing comprises a first unit housing member and a second unit housing member, the first unit housing member is combined with the second unit housing member, the interior space is formed between the first unit housing member and the second unit housing member, a plurality of first heat conductive posts are formed on the inside of the first unit housing member, a plurality of second heat conductive posts are formed on the inside of the second unit housing member, and the first heat conductive posts and the second heat conductive posts are formed in the interior space.

In one embodiment, the cooling unit further comprises a waterproof ring, the waterproof ring is sandwiched between the first unit housing member and the second unit housing member, and the waterproof ring surrounds the interior space.

In one embodiment, the first unit housing member comprises an annular rib, the second unit housing member comprises an annular groove, the waterproof ring is disposed in the annular groove, and the annular rib is inserted into the annular groove.

In one embodiment, the unit housing comprises an infusion hole, and the working fluid is infused into the interior space via the infusion hole.

In one embodiment, the cooling unit further comprises a sealing plug, and the sealing plug is connected to the infusion hole with thread to seal the infusion hole.

In one embodiment, the interior space comprises a flow path. The cooling unit comprises a fluid inlet and a fluid outlet. The fluid inlet is connected to one end of the flow path, and the fluid outlet is connected to the other end of the flow path. The working fluid enters the flow path via the fluid inlet and leaves the flow path via the fluid outlet, removing heat from the cooling unit.

In one embodiment, the unit housing further comprises a heat conductive rib, and the heat conductive rib is formed in the flow path.

In one embodiment, the flow path is U-shaped, and the heat conductive rib extends along the flow path.

In one embodiment, the device housing and at least a portion of the unit housing are integrally formed.

In one embodiment, the memory device further comprises a heat conductive material. The device housing is connected to the unit housing by wedging or screwing, and the heat conductive material is disposed between the device housing and the unit housing.

In one embodiment, a plurality of unit housing ribs are formed on a surface of the unit housing.

In one embodiment, the device housing further comprises an air inlet and an air outlet. Air flow passes through the air inlet and the air outlet in the first direction. The unit housing ribs extend in the first direction.

In one embodiment of the invention, the working fluid inside the interior space (chamber) is utilized to absorb the heat, and the temperature of the whole memory device is prevented from rising rapidly. The safety of the memory device is improved, and the life span of the memory device is increased. In one embodiment, the working fluid can be water, or other working fluid with temperature stabilizing ability.

In another embodiment of the invention, the working fluid inside the interior space (flow path) transports the heat. The fluid inlet and the fluid outlet are connected to an external pipe, the working fluid removes the heat from the memory device and the heat is dissipated by an external heat dissipation device, and the heat dissipation efficiency of the memory device can be improved. In one embodiment, the working fluid can be water, or other working fluid with thermal transportation ability.

Utilizing the memory of the embodiment of the invention, the cooling unit improves the heat dissipation efficiency of the memory device. The power and capacity of the memory device can be increased, to satisfy increasingly stringent storage requirements.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
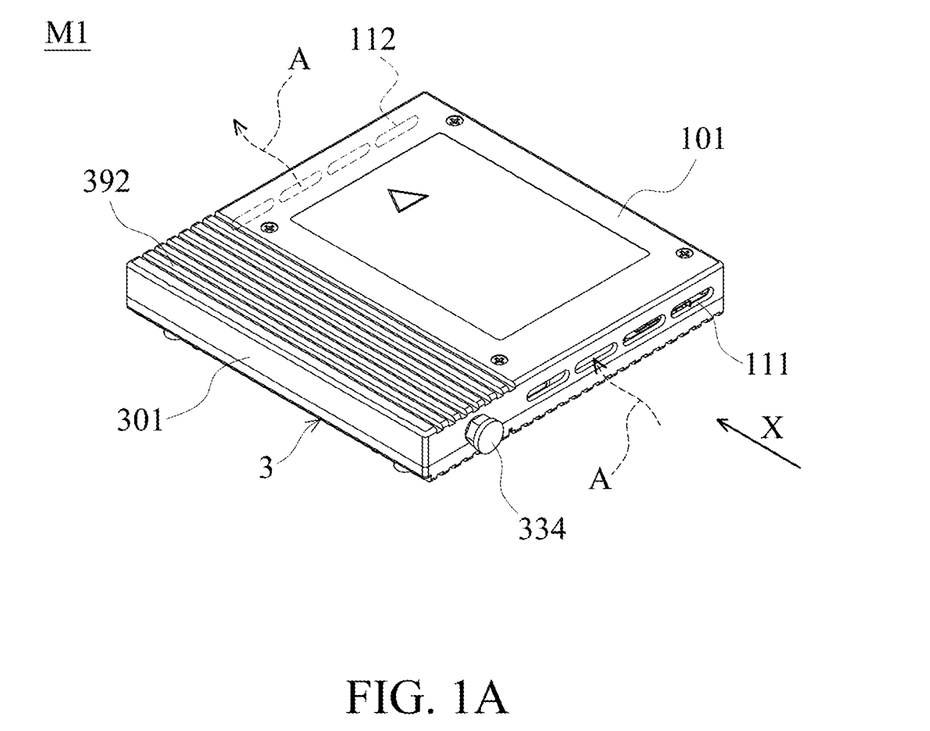
FIG. 1A is a perspective view of a memory device of a first embodiment of the invention.
Figure 1B:
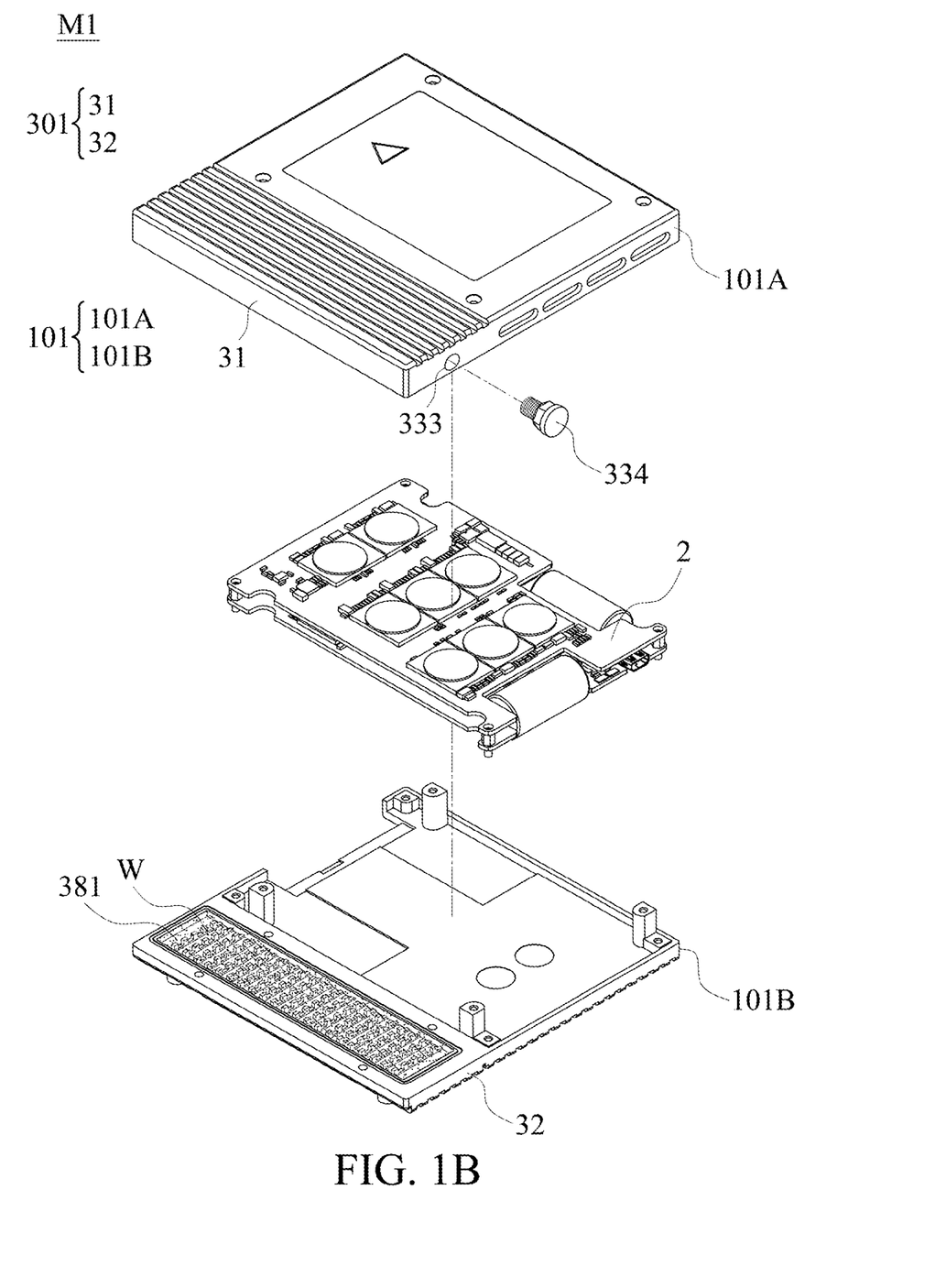
FIG. 1B is an exploded view of the memory device of the first embodiment of the invention.

FIG. 1A is a perspective view of a memory device of a first embodiment of the invention. FIG. 1B is an exploded view of the memory device of the first embodiment of the invention. With reference to FIGS. 1A and 1B, in one embodiment, a memory device M1 is provided. The memory device M1 includes a device housing 10, a memory module 2 and a cooling unit 3. The memory module 2 is disposed in the device housing 101. The memory module 2 generates heat. The heat is transmitted to the device housing 101. The cooling unit 3 is thermally connected to the device housing 101 to dissipate some of the heat. The cooling unit 3 includes a unit housing 301 and a working fluid W. An interior space 381 is formed in the unit housing 301. The working fluid W is disposed in the interior space 381. Some of the heat travels from the device housing 101, passes through the unit housing 301, and is transmitted to the working fluid W.

In one embodiment, the memory device can be a solid-state disk, or another memory device.

Figure 2A:
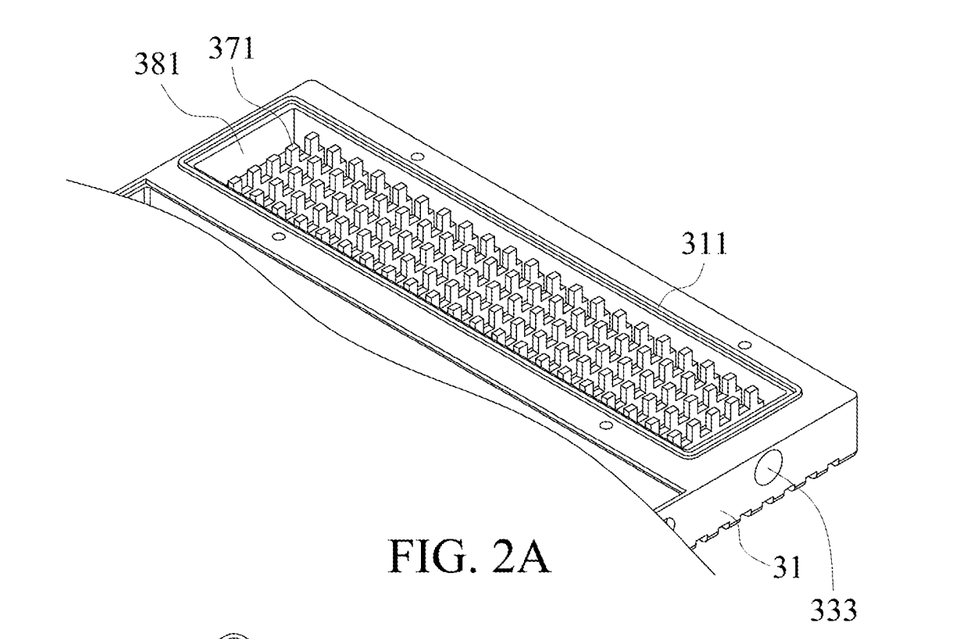
FIG. 2A is a first unit housing member of the embodiment of the invention.
Figure 2B:
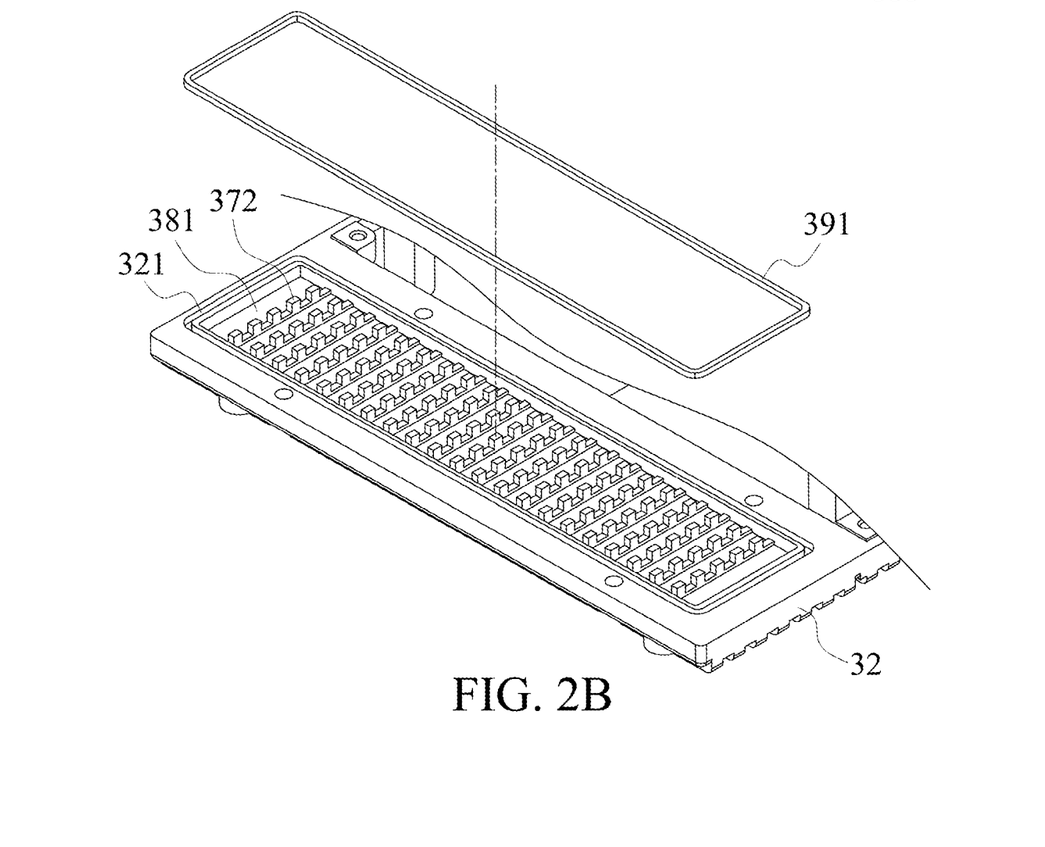
FIG. 2B is a second unit housing member of the embodiment of the invention.

FIG. 2A is a first unit housing member of the embodiment of the invention. FIG. 2B is a second unit housing member of the embodiment of the invention. With reference to FIGS. 1B, 2A and 2B, in one embodiment, the unit housing 301 comprises a first unit housing member 31 and a second unit housing member 32. The first unit housing member 31 is combined with the second unit housing member 32. The interior space 381 is formed between the first unit housing member 31 and the second unit housing member 32.

With reference to FIGS. 1B, 2A and 2B, the interior space 381 is a chamber. The working fluid W is disposed in the chamber (interior space 381). A heat conductive structure is formed in the chamber (interior space 381), and the heat conductive structure contacts the working fluid W. In one embodiment, the heat conductive structure comprises a plurality of heat conductive posts (including a plurality of first heat conductive posts 371 and a plurality of second heat conductive posts 372). The heat conductive posts are arranged in a matrix. Particularly, in one embodiment, a plurality of first heat conductive posts 371 are formed on the inside of the first unit housing member 31. A plurality of second heat conductive posts 372 are formed on the inside of the second unit housing member 32. The first heat conductive posts 371 and the second heat conductive posts 372 are formed in the interior space 381.

In one embodiment, the first heat conductive posts 371 are arranged in a matrix, and the second heat conductive posts 372 are arranged in a matrix. The first heat conductive posts 371 and the second heat conductive posts 372 can be cubes, cylinders or other structures. The heat conductive structure can have concavo-convex structures to increase contact area between the unit housing 301 and the working fluid W, and the heat is sufficiently transmitted from the unit housing 301 to the working fluid W.

Figure 2C:
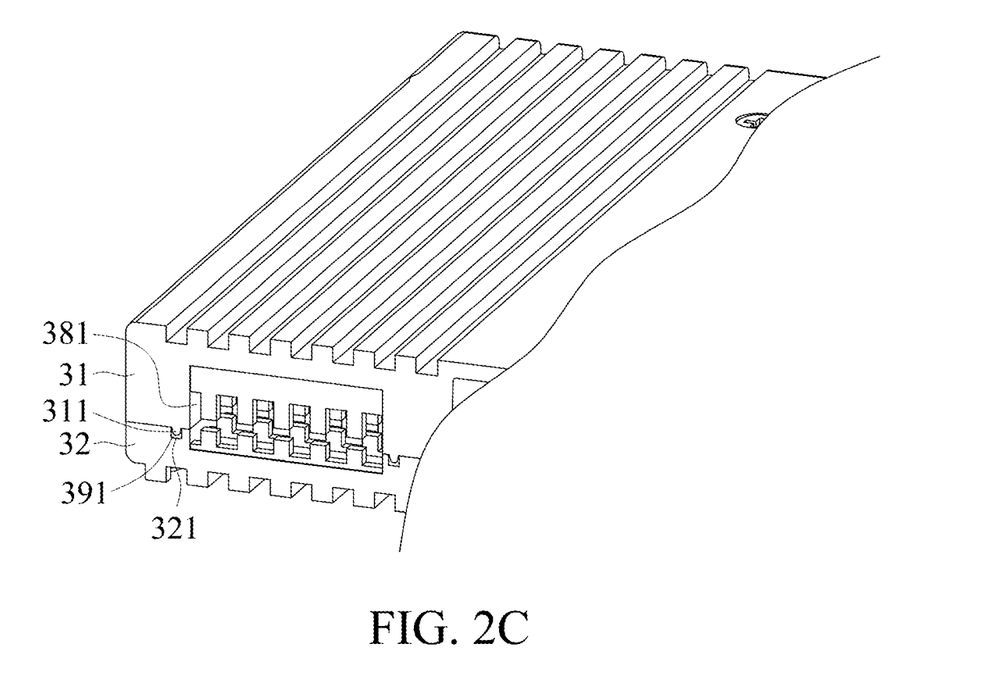
FIG. 2C is a cross sectional view of the cooling unit of the embodiment of the invention.

FIG. 2C is a cross sectional view of the cooling unit of the embodiment of the invention. With reference to FIGS. 2A, 2B and 2C, in one embodiment, the cooling unit 3 further comprises a waterproof ring 391. The waterproof ring 391 is sandwiched between the first unit housing member 31 and the second unit housing member 32. The waterproof ring 391 surrounds the interior space 381.

With reference to FIGS. 2A, 2B and 2C, in one embodiment, the first unit housing member 31 comprises an annular rib 311. The second unit housing member 32 comprises an annular groove 321. The waterproof ring 391 is disposed in the annular groove 321, and the annular rib 311 is inserted into the annular groove 321.

With reference to FIGS. 1A and 1B, in one embodiment, the unit housing 301 comprises an infusion hole 333, and the working fluid W is infused into the interior space 381 via the infusion hole 333. In this embodiment, the infusion hole 333 is located on the first unit housing member 31.

Figure 3:
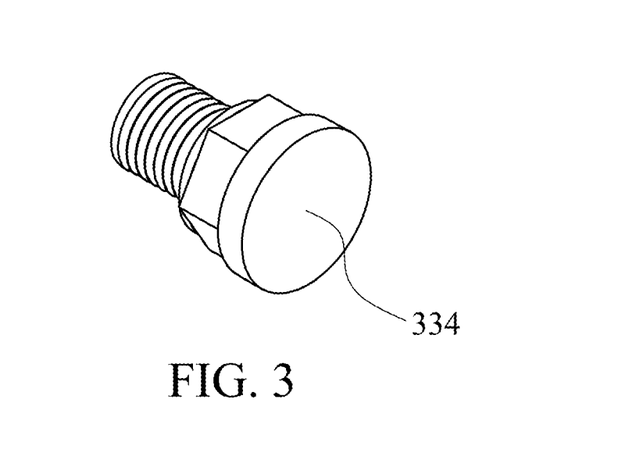
FIG. 3 shows a sealing plug of the first embodiment of the invention.

FIG. 3 shows a sealing plug of the first embodiment of the invention. With reference of FIGS. 1A, 1B and 3, in one embodiment, the cooling unit 3 further comprises a sealing plug 334, and the sealing plug 334 is connected to the infusion hole 333 with thread to seal the infusion hole 333.

With reference to FIG. 1B, in one embodiment, the device housing 101 and at least a portion of the unit housing 301 are integrally formed. In this embodiment, the device housing 101 comprises a first device housing member 101A and a second device housing member 101B. The first device housing member 101A and the first unit housing member 31 are integrally formed, and the second device housing member 101B and second unit housing member 32 are integrally formed.

With reference to FIG. 1A, in one embodiment, a plurality of unit housing ribs 392 are formed on a surface of the unit housing 301. The unit housing ribs 392 improves heat dissipation efficiency of the cooling unit 3.

With reference to FIG. 1A, in one embodiment, the device housing 101 further comprises an air inlet 111 and an air outlet 112. Air flow A passes through the air inlet 111 and the air outlet 112 in a first direction X, and the unit housing ribs 392 extend in the first direction X. Therefore, the outer air flow can travel along the unit housing ribs 392, removing heat from the unit housing ribs 392.

Figure 4:
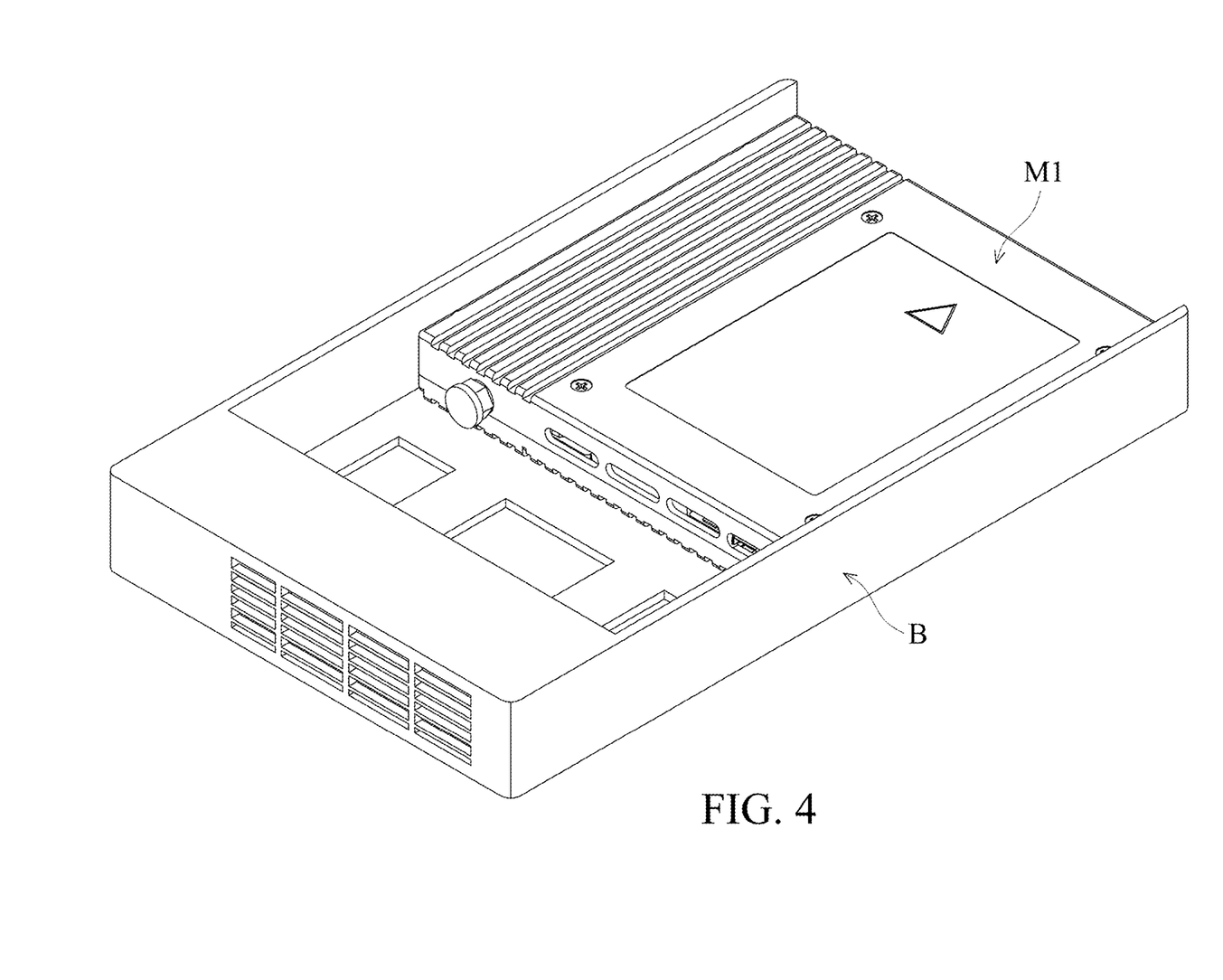
FIG. 4 shows the memory device of the embodiment of the invention disposed on a bracket.

FIG. 4 shows the memory device of the embodiment of the invention disposed on a bracket. With reference to FIG. 4, the memory device M1 of the embodiment of the invention is adapted to be disposed on a bracket B, and is connected to an electronic device (such as a server or a computer, not shown) via the bracket B. In one embodiment, the memory device can be a 2.5-inch solid-state disk, and the bracket can be a 3.5-inch sized bracket. Therefore, the memory device and the bracket of the embodiment of the invention can be mounted to the server or the computer designed for 3.5-inch solid-state disk without modifying the design of the server or the computer.

In the first embodiment of the invention, the working fluid inside the interior space (chamber) is utilized to absorb the heat, and the temperature of the whole memory device is prevented from rising rapidly. The safety of the memory device is improved, and the life span of the memory device is increased. In one embodiment, the working fluid can be water, or other working fluid with temperature stabilizing ability.

Figure 5A:
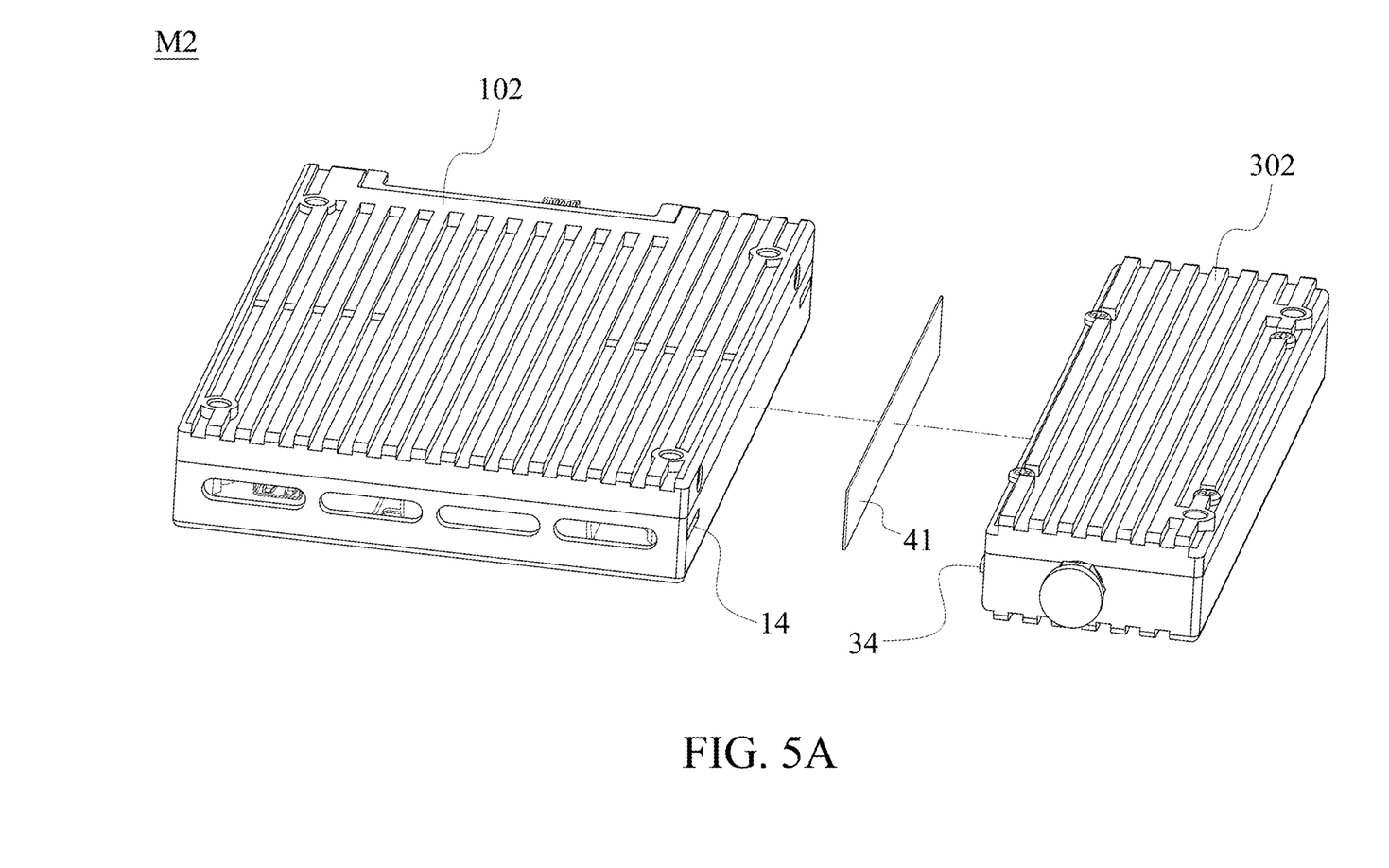
FIG. 5A is an exploded view of a memory device of a second embodiment of the invention.
Figure 5B:
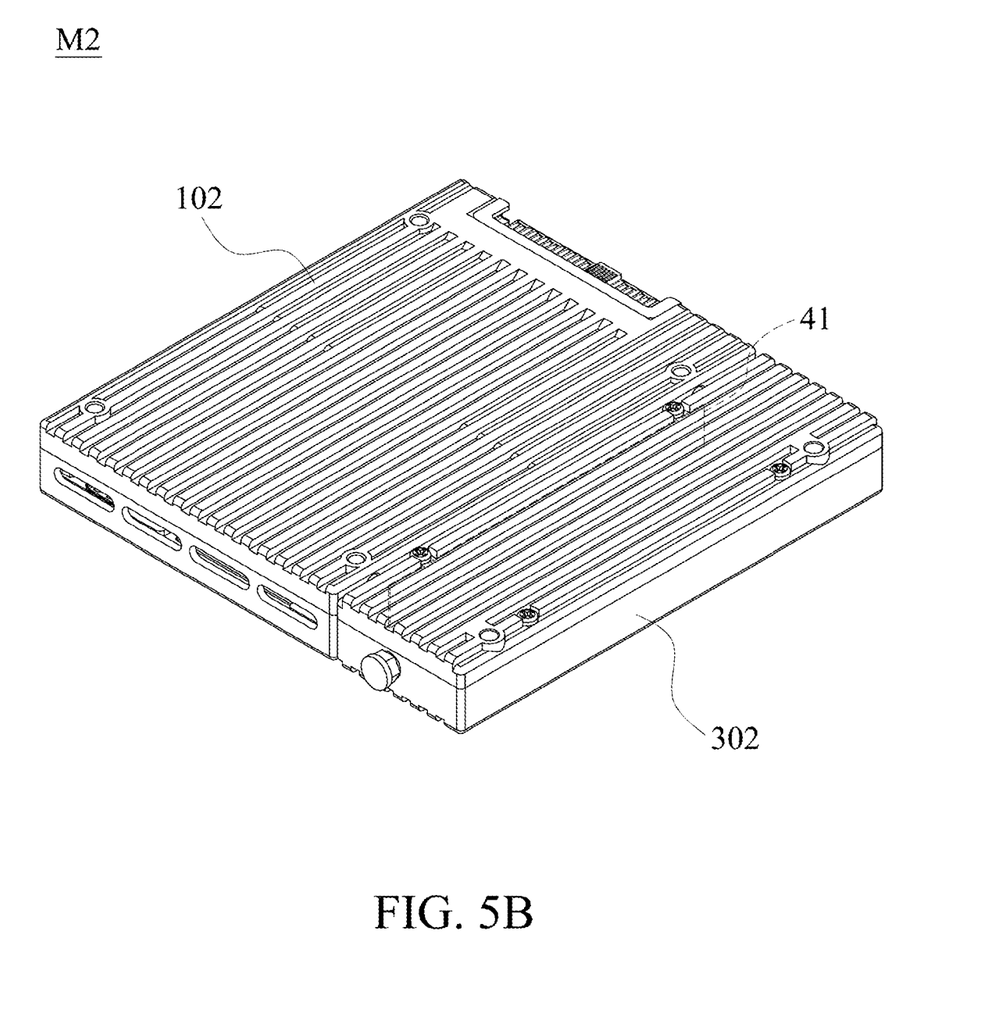
FIG. 5B is an assembled view of the memory device of the second embodiment of the invention.

FIG. 5A is an exploded view of a memory device of a second embodiment of the invention. FIG. 5B is an assembled view of the memory device of the second embodiment of the invention. With reference to FIGS. 5A and 5B, in one embodiment, the memory device M2 further comprises a heat conductive material 41. The device housing 102 is connected to the unit housing 302 by wedging or screwing, and the heat conductive material 41 is disposed between the device housing 102 and the unit housing 302. In this embodiment, the device housing 102 comprises a plurality of wedging grooves 14, the unit housing 302 comprises a plurality of wedging protrusions 34, and the wedging protrusions 34 are wedged to the wedging grooves 14.

Figure 6A:
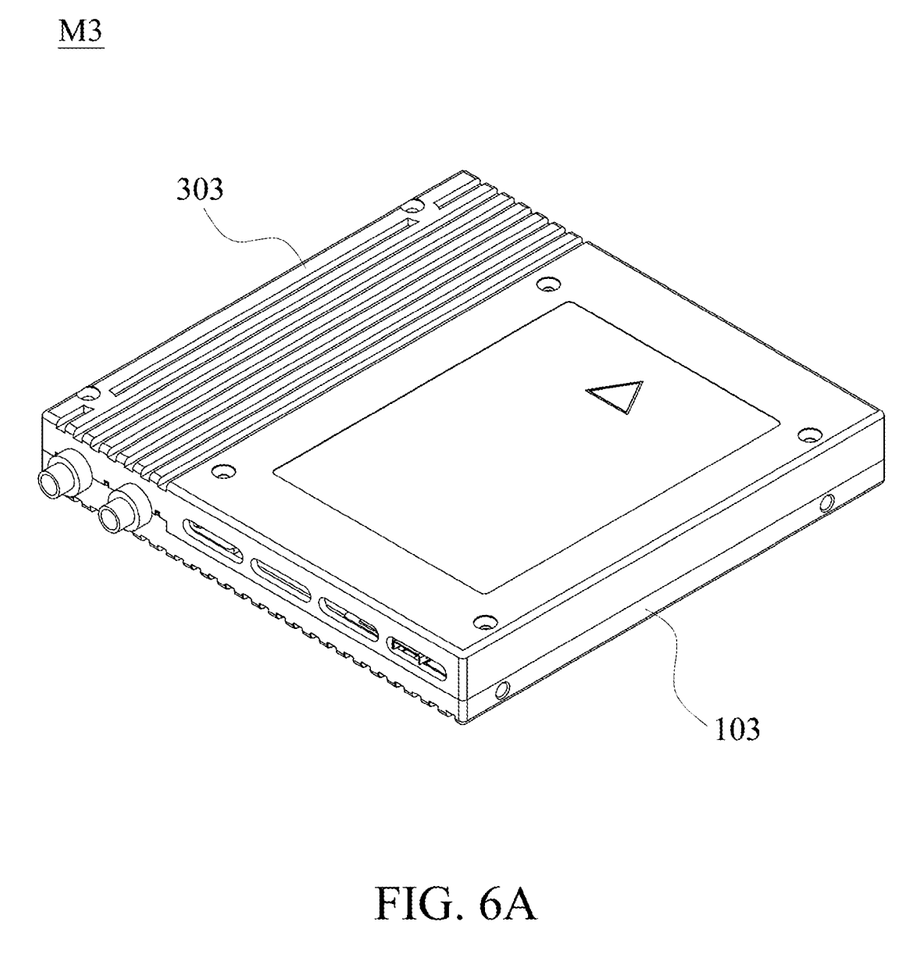
FIG. 6A is an assembled view of a memory device of a third embodiment of the invention.
Figure 6B:
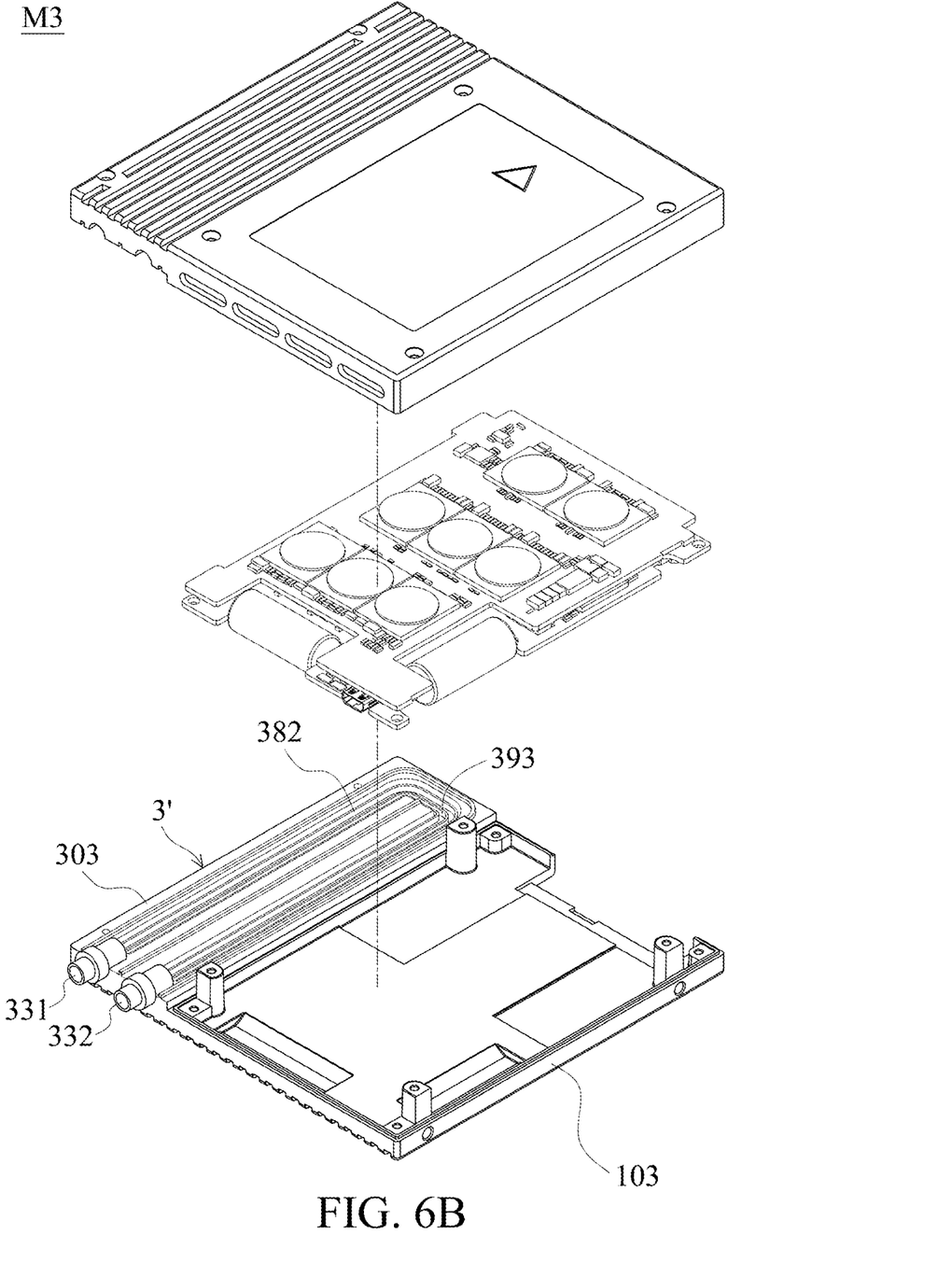
FIG. 6B is an exploded view of the memory device of the third embodiment of the invention.

FIG. 6A is an assembled view of a memory device of a third embodiment of the invention. FIG. 6B is an exploded view of the memory device of the third embodiment of the invention. With reference to FIGS. 6A and 6B, in one embodiment, the interior space of the unit housing 303 is a flow path 382. The cooling unit 3' of the memory device M3 comprises a fluid inlet 331 and a fluid outlet 332. The fluid inlet 331 is connected to one end of the flow path 382, and the fluid outlet 332 is connected to the other end of the flow path 382. The working fluid (not shown) enters the flow path 382 via the fluid inlet 331, and leaves the flow path 382 via the fluid outlet 332 to remove the heat from the cooling unit 3'.

With reference to FIG. 6B, in one embodiment, the unit housing 303 further comprises a heat conductive rib 393, and the heat conductive rib 393 is formed in the flow path 282. In one embodiment, the flow path 382 is U-shaped, and the heat conductive rib 393 extends along the flow path 382. The heat conductive rib 393 improves the heat transmission efficiency between the unit housing 303 and the working fluid.

With reference to FIGS. 6A and 6B, similar to the embodiments mentioned above, the unit housing 303 can be integrally formed with the device housing 103, or be connected to the device housing 103 by other means.

In the second embodiment of the invention, the working fluid inside the interior space (flow path) transports the heat. The fluid inlet and the fluid outlet are connected to an external pipe, the working fluid removes the heat from the memory device and the heat is dissipated by an external heat dissipation device, and the heat dissipation efficiency of the memory device can be improved. In one embodiment, the working fluid can be water, or other working fluid with thermal transportation ability.

Utilizing the memory of the embodiment of the invention, the cooling unit improves the heat dissipation efficiency of the memory device. The power and capacity of the memory device can be increased, to satisfy increasingly demanding storage requirements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
a device housing;
a memory module, disposed in the device housing, wherein the memory module generates heat, and the heat is transmitted to the device housing; and
a cooling unit, thermally connected to the device housing to dissipate a part of the heat, wherein the cooling unit comprises:
a unit housing, wherein an interior space is formed in the unit housing; and
a working fluid, disposed in the interior space, wherein a part of the heat travels from the device housing, passes through the unit housing, and is transmitted to the working fluid,
wherein the interior space comprises a flow path, the cooling unit comprises a fluid inlet and a fluid outlet, the fluid inlet is connected to one end of the flow path, the fluid outlet is connected to the other end of the flow path, and the working fluid enters the flow path via the fluid inlet and leaves the flow path via the fluid outlet to remove the heat from the cooling unit.

2. The memory device as claimed in claim 1, wherein the interior space comprises a chamber, the working fluid is disposed in the chamber, a heat conductive structure is formed in the chamber, and the heat conductive structure contacts the working fluid.

3. The memory device as claimed in claim 2, wherein the heat conductive structure comprises a plurality of heat conductive posts, and the plurality of heat conductive posts are arranged in a matrix.

4. The memory device as claimed in claim 1, wherein the unit housing comprises a first unit housing member and a second unit housing member, the first unit housing member is combined with the second unit housing member, the interior space is formed between the first unit housing member and the second unit housing member, a plurality of first heat conductive posts are formed on an inner side of the first unit housing member, a plurality of second heat conductive posts are formed on an inner side of the second unit housing member, and the plurality of first heat conductive posts and the plurality of second heat conductive posts are formed in the interior space.

5. The memory device as claimed in claim 4, wherein the cooling unit further comprises a waterproof ring, the waterproof ring is sandwiched between the first unit housing member and the second unit housing member, and the waterproof ring surrounds the interior space.

6. The memory device as claimed in claim 5, wherein the first unit housing member comprises an annular rib, the second unit housing member comprises an annular groove, the waterproof ring is disposed in the annular groove, and the annular rib is inserted into the annular groove.

7. The memory device as claimed in claim 4, wherein the unit housing comprises an infusion hole, and the working fluid is infused into the interior space via the infusion hole.

8. The memory device as claimed in claim 7, wherein the cooling unit further comprises a sealing plug, and the sealing plug is connected to the infusion hole with thread to seal the infusion hole.

9. The memory device as claimed in claim 1, wherein the unit housing further comprises a heat conductive rib, and the heat conductive rib is formed in the flow path.

10. The memory device as claimed in claim 9, wherein the flow path is U-shaped, and the heat conductive rib extends along the flow path.

11. The memory device as claimed in claim 1, wherein the device housing and at least a portion of the unit housing are integrally formed.

12. A memory device, comprising:

a device housing;

a memory module, disposed in the device housing, wherein the memory module generates heat, and the heat is transmitted to the device housing; and a cooling unit, thermally connected to the device housing to dissipate a part of the heat, wherein the cooling unit comprises:

a unit housing, wherein an interior space is formed in the unit housing;

a working fluid, disposed in the interior space, wherein a part of the heat travels from the device housing, passes through the unit housing, and is transmitted to the working fluid; and a heat conductive material, wherein the device housing is connected to the unit housing by wedging or screw, and the heat conductive material is disposed between the device housing and the unit housing.

13. A memory device, comprising:

a device housing;

a memory module, disposed in the device housing, wherein the memory module generates heat, and the heat is transmitted to the device housing; and a cooling unit, thermally connected to the device housing to dissipate a part of the heat, wherein the cooling unit comprises:

a unit housing, wherein an interior space is formed in the unit housing;

a working fluid, disposed in the interior space, wherein a part of the heat travels from the device housing, passes through the unit housing, and is transmitted to the working fluid, wherein a plurality of unit housing ribs are formed on a surface of the unit housing, wherein the device housing further comprises an air inlet and an air outlet, air flow passes through the air inlet and the air outlet in a first direction, and the unit housing ribs extend in the first direction.

* * * * *